US012588363B2

(12) United States Patent
Du et al.

(10) Patent No.: US 12,588,363 B2
(45) Date of Patent: Mar. 24, 2026

(54) LIGHT-EMITTING SUBSTRATE WITH FIRST FUNCTIONAL SUB-LAYER, DISPLAY PANEL WITH FIRST FUNCTIONAL SUB-LAYER, LIGHT-EMITTING EQUIPMENT INCLUDING LIGHT-EMITTING SUBSTRATE, METHOD AND APPARATUS FOR MANUFACTURING LIGHT-EMITTING SUBSTRATE

(71) Applicant: BOE TECHNOLOGY GROUP CO., LTD., Beijing (CN)

(72) Inventors: Xiaobo Du, Beijing (CN); Yansong Li, Beijing (CN); Guanyin Wen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 718 days.

(21) Appl. No.: 17/537,622

(22) Filed: Nov. 30, 2021

(65) Prior Publication Data

US 2022/0293702 A1 Sep. 15, 2022

(30) Foreign Application Priority Data

Mar. 9, 2021 (CN) ......................... 202110255370.X

(51) Int. Cl.
H10K 59/122 (2023.01)
H10K 50/17 (2023.01)
(Continued)

(52) U.S. Cl.
CPC ........... H10K 59/122 (2023.02); H10K 50/17 (2023.02); H10K 59/80 (2023.02);
(Continued)

(58) Field of Classification Search
CPC .............................. H10K 50/17; H10K 50/80
See application file for complete search history.

(56) References Cited

U.S. PATENT DOCUMENTS

| | | | |
|---|---|---|---|
| 10,886,345 B2 | 1/2021 | Sun et al. | |
| 11,545,529 B2 | 1/2023 | Jia et al. | |

(Continued)

FOREIGN PATENT DOCUMENTS

| | | |
|---|---|---|
| CN | 108717942 A | 10/2018 |
| CN | 208622729 U | 3/2019 |

*Primary Examiner* — Sue A Purvis
*Assistant Examiner* — Seyon Ali-Simah Punchbeddell
(74) *Attorney, Agent, or Firm* — HOUTTEMAN LAW LLC

(57) ABSTRACT

A light-emitting substrate includes a base substrate, a pixel defining layer, a first electrode layer and a light-emitting functional layer. The pixel defining layer has a plurality of opening portions; the first electrode layer includes a plurality of first electrodes, at least a part of each first electrode is exposed to one of the opening portions and constitutes an accommodating portion with the opening portion; the light-emitting functional layer includes a plurality of functional sub-layers, at least one of which is a first functional sub-layer, the first functional sub-layer includes a plurality of functional patterns, each of which is located in one of the accommodating portions and is conformal to a surface of the accommodating portion, and a distance from an edge of the functional pattern to the base substrate is smaller than or equal to a distance from an edge of the accommodating portion to the base substrate.

10 Claims, 8 Drawing Sheets

100

130

(51) Int. Cl.
  *H10K 59/80*     (2023.01)
  *H10K 71/00*     (2023.01)
  *H10K 59/12*     (2023.01)

(52) U.S. Cl.
  CPC ....... *H10K 59/80521* (2023.02); *H10K 71/00*
      (2023.02); *H10K 59/1201* (2023.02)

(56)       References Cited

U.S. PATENT DOCUMENTS

| | | | |
|---|---|---|---|
| 2016/0284774 A1* | 9/2016 | Zhang | H10D 86/411 |
| 2018/0166648 A1* | 6/2018 | Dai | H10K 59/124 |
| 2018/0342563 A1* | 11/2018 | You | H10K 59/122 |
| 2020/0343322 A1* | 10/2020 | Jia | H10K 71/00 |

\* cited by examiner

E

160

147
146
145
140 { 144
143
142
141

130

100

145       143
146       142
147       141

170
160

144
120
130
110

(a)

(b)

(a)

(b)

(c)

100

LIGHT-EMITTING SUBSTRATE WITH FIRST FUNCTIONAL SUB-LAYER, DISPLAY PANEL WITH FIRST FUNCTIONAL SUB-LAYER, LIGHT-EMITTING EQUIPMENT INCLUDING LIGHT-EMITTING SUBSTRATE, METHOD AND APPARATUS FOR MANUFACTURING LIGHT-EMITTING SUBSTRATE

CROSS REFERENCE TO RELATED APPLICATIONS

The present disclosure claims the priority of the Chinese Patent Application No. 202110255370.X entitled "light-emitting substrate, light-emitting equipment, method and apparatus for manufacturing light-emitting substrate" filed on Mar. 9, 2021, the content of which is incorporated herein by reference in its entirety.

TECHNICAL FIELD

The present disclosure relates to the field of light-emitting and display technologies, and in particular, to a light-emitting substrate, a display panel, a light-emitting equipment, a method and an apparatus for manufacturing the light-emitting substrate.

BACKGROUND

A display panel (also called as a display screen) may be of any type, such as an Organic Light-Emitting Diode (OLED) display panel, a Quantum Dot Light-Emitting Diode (QLED) display panel, and the like. For example, the OLED display panel has become a display panel with great competitiveness and development prospect due to advantages of an all-solid-state structure, high brightness, a full viewing angle, a fast response speed, a wide operating temperature range and the like. A light-emitting device of the OLED display panel is a structure formed by stacking a plurality of layers of thin films, and a hole injection layer of the light-emitting device is a whole layer formed by vacuum evaporation, and a material for forming the hole injection layer is usually a p-type doped material, so that the hole injection layer has characteristics similar to a conductor. When the OLED display panel is powered on, current is transmitted transversely along a light-emitting surface of the OLED display panel through the hole injection layer, so that the current for driving light emission in one sub-pixel is transmitted to adjacent sub-pixels, and the three sub-pixels of red (R), green (G) and blue (B) of the OLED display panel are usually arranged at intervals, thereby causing a problem of light emission crosstalk.

The prior art may solve the above problem by using a high-precision metal mask to form a film layer such as a hole injection layer, but the manufacturing cost of the OLED display panel will be greatly increased due to the high manufacturing cost of the high-precision metal mask.

SUMMARY

Embodiments of the present disclosure provide a light-emitting substrate, a display panel, a light-emitting equipment, a method and an apparatus for manufacturing a light-emitting substrate, so as to reduce the manufacturing cost of light-emitting functional layers while solving the problem of light emission crosstalk in the light-emitting substrate.

In order to achieve the above purpose, the embodiments of the present disclosure adopt the following technical solutions:

In a first aspect, there is provided a light-emitting substrate including a base substrate, a pixel defining layer, a first electrode layer and a light-emitting functional layer. The pixel defining layer is disposed on the base substrate and has a plurality of opening portions; the first electrode layer includes a plurality of first electrodes, at least a part of each first electrode is exposed to one opening portion and constitutes an accommodating portion with the opening portion; the light-emitting functional layer is arranged on a side of the first electrode layer away from the base substrate and includes a plurality of functional sub-layers, at least one of which is a first functional sub-layer, the first functional sub-layer includes a plurality of functional patterns, each of the functional patterns is located in one of the accommodating portions and is conformal to a surface of the accommodating portion, and a distance from an edge of each functional pattern to the base substrate is smaller than or equal to a distance from an edge of the accommodating portion to the base substrate. Here, the "edge" of a component is relative to the center of the component, i.e., the "outer edge" of the component. In a plan view, the "edge" of a component constitutes the outer contour of the component.

In some embodiments, at least two of the functional sub-layers in the light-emitting functional layer are first functional sub-layers.

In some embodiments, among the functional patterns disposed in the same accommodating portion, a distance from an edge of a functional pattern farthest from the base substrate to the base substrate is smaller than a distance from an edge of a functional pattern closest to the base substrate to the base substrate, or for every two adjacent functional patterns disposed in the same accommodating portion, a distance from an edge of a functional pattern farther away from the base substrate to the base substrate is smaller than a distance from an edge of a functional pattern closer to the base substrate to the base substrate.

In some embodiments, the plurality of functional sub-layers includes: an emission layer including a plurality of light-emitting patterns, each of the light-emitting patterns being located in one of the accommodating portions; at least one first functional sub-layer arranged on a side of the emission layer close to the base substrate; and at least one first functional sub-layer arranged on a side of the emission layer away from the base substrate. In the same accommodating portion, the functional patterns of the first functional sub-layers arranged on both sides of the emission layer are configured to wrap the light-emitting patterns.

In some embodiments, all of the functional sub-layers in the light-emitting functional layer are the first functional sub-layers.

In some embodiments, a surface of the pixel defining layer on a side away from the base substrate base is uneven.

In some embodiments, the surface of the pixel defining layer on a side of away from the base substrate has a plurality of mutually parallel strip-shaped grooves parallel to each other.

In some embodiments, a cross-section of the strip-shaped groove is triangular.

In some embodiments, an edge of the functional pattern of the first functional sub-layer is uneven in a thickness direction of the light-emitting substrate.

In some embodiments, the first functional sub-layer is a hole injection layer, a hole transport layer, a light-emitting prime layer, a hole block layer, an electron transport layer, an electron injection layer, or an emission layer.

In some embodiments, the light-emitting substrate further includes a second electrode layer positioned on a side of the light-emitting functional layer away from the base substrate, the second electrode layer is conformal to surfaces of the light-emitting functional layer and the pixel defining layer away from the base substrate.

In some embodiments, there is provided a display panel comprising: a base substrate; a pixel defining layer disposed on the base substrate, the pixel defining layer having a plurality of opening portions; a first electrode layer comprising a plurality of first electrodes, at least a part of each of the first electrodes being exposed to one of the opening portions and constituting an accommodating portion with the opening portion; and a light-emitting functional layer arranged on a side of the first electrode layer away from the base substrate, the light-emitting functional layer comprising a plurality of functional sub-layers, at least one of which is a first functional sub-layer, the first functional sub-layer comprising a plurality of functional patterns, each of the functional patterns being located in one of the accommodating portions and being conformal to a surface of the accommodating portion, and a distance from an edge of the functional pattern to the base substrate being smaller than or equal to a distance from an edge of the accommodating portion to the base substrate.

In a second aspect, there is provided a light-emitting equipment which includes the light-emitting substrate according to any one of the above embodiments.

In a third aspect, there is provided an apparatus for manufacturing a light-emitting substrate, which is configured to manufacture a light-emitting functional layer in the light-emitting substrate. The apparatus includes at least one material removal assembly, each material removal assembly includes a support part and a material removal layer arranged on a surface of the support part, wherein the material removal layer is configured to adsorb or adhere at least one material in a light-emitting functional layer.

In some embodiments, the material removal assembly is a roller assembly, wherein the support part in the roller assembly is a roller; the material removal layer coats the roller along a circumferential direction of the roller.

In some embodiments, the apparatus includes a plurality of roller assemblies, radiuses of the plurality of roller assemblies are the same, and rotation axes of the rollers are parallel to each other. In addition, the apparatus further includes a connecting member which is connected to each of the rollers at a position on the rotation axis of the roller.

In some embodiments, the roller has a radius of 1 cm to 10 cm.

In some embodiments, a material of the material removal layer is one of porous ceramic, optical adhesive, and silica gel; and/or, a thickness of the material removal layer is greater than or equal to a total thickness of the first functional sub-layers in the light-emitting functional layer, or the thickness of the material removal layer ranges from 0.1 $\mu$m to 1 $\mu$m.

In some embodiments, a surface of the material removal layer away from the support part is uneven.

In a fourth aspect, there is provided a method for manufacturing a light-emitting substrate, including:

forming a first electrode layer and a pixel defining layer on a base substrate; wherein the pixel defining layer has a plurality of opening portions; the first electrode layer includes a plurality of first electrodes, at least a part of each first electrode is exposed to one opening portion and constitutes an accommodating portion with the opening portion;

forming at least one thin film on the base substrate on which the first electrode layer and the pixel defining layer are formed;

bringing a material removal layer in the above apparatus for manufacturing a light-emitting substrate into contact with the uppermost thin film of the at least one thin film, such that the material removal layer in the apparatus adsorbs or adheres the material of the at least one thin film to form at least one first functional sub-layer. Each first functional sub-layer includes a plurality of functional patterns, each functional pattern is located in one accommodating portion and is conformal to a surface of the accommodating portion, a distance from an edge of the functional pattern to the base substrate is smaller than or equal to a distance from an edge of the accommodating portion to the base substrate, and at least one first functional sub-layer is in the light-emitting functional layer.

The above apparatus for manufacturing light-emitting substrate provided by the third aspect includes a material removal assembly mainly composed of a support part and a material removal layer, the material removal assembly is simple in structure, and since a fine structure of a sub-pixel size level does not need to be provided on the material removal assembly, the manufacturing cost is low compared to a fine mask.

Accordingly, in the above method for manufacturing a light-emitting substrate provided by the fourth aspect, the first functional sub-layer in the light-emitting functional layer is manufactured with the above apparatus, and since a fine mask is not required to be used, the cost for manufacturing the light-emitting functional layer with the manufacturing method is greatly reduced.

In addition, the above light-emitting substrate provided by the first aspect includes a first functional sub-layer, wherein each functional pattern of the first functional sub-layer is located in one accommodating portion and constitutes an accommodating portion with a surface of the accommodating portion where the functional pattern is located, and a distance from an edge oft functional pattern to the base substrate is smaller than or equal to a distance from an edge of the accommodating portion to the base substrate, so that the functional patterns of the first functional sub-layer are not connected with each other, and thus it may be ensured that the current of each sub-pixel in the light-emitting substrate is not transmitted to the adjacent sub-pixel through the first functional sub-layer, and the problem of light emission crosstalk in the light-emitting substrate is solved. In addition, the light-emitting substrate including the first functional sub-layer may be manufactured by the above manufacturing method, so that the manufacturing cost of the light-emitting functional layer may be reduced.

The above light-emitting equipment provided by the second aspect includes the above light-emitting substrate, and thus, the beneficial effects achieved by the light-emitting equipment may refer to the beneficial effects of the light-emitting substrate, and the details are not repeated here.

BRIEF DESCRIPTION OF DRAWINGS

In order to more clearly illustrate the technical solutions of the embodiments of the present disclosure, the drawings required in the description of the embodiments or the prior art will be briefly described below, it is obvious that the drawings in the following description are only some embodiments of the present disclosure, and other drawings may be obtained according to these drawings by those skilled in the art without inventive efforts.

DETAIL DESCRIPTION OF EMBODIMENTS

Figures 1, 2:
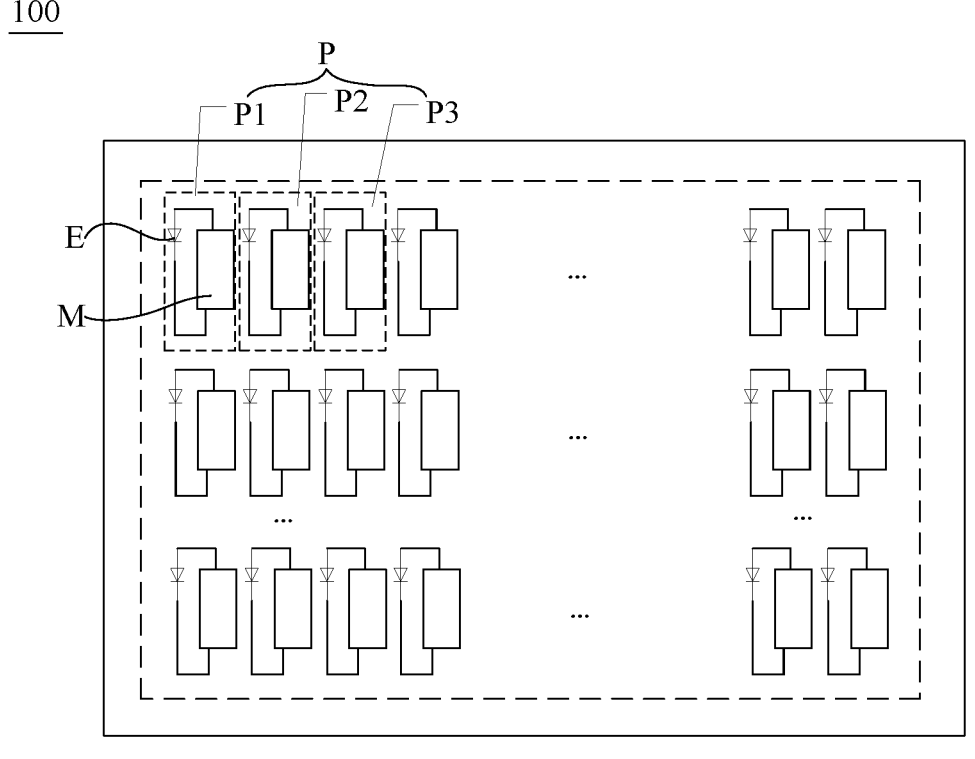
FIG. 1 is a schematic top view of a light-emitting substrate provided by some embodiments of the present disclosure.
FIG. 2 is a schematic view of the light-emitting substrate shown in FIG. 1.

The technical solutions of the embodiments of the present disclosure will be described clearly and completely with reference to the drawings in the embodiments of the present disclosure, and it is obvious that the embodiments described are only some embodiments of the present disclosure, rather than all embodiments. All other embodiments, which may be derived by a person skilled in the art from the embodiments disclosed herein without inventive step, are within the scope of the present disclosure.

In the description of the present disclosure, it is to be understood that the terms "center", "upper", "lower", "front", "rear", "left", "right", "vertical", "horizontal", "top", "bottom", "inner", "outer", and the like indicate orientations or positional relationships based on those shown in the drawings, and are only for convenience of description and simplicity of description, but do not indicate or imply that the device or element referred to must have a particular orientation, be constructed and be operated in a particular orientation, and thus, are not to be construed as limiting the present disclosure.

Unless the context requires otherwise, throughout the specification and the claims, the word "comprise" and its other forms such as "comprises" and "comprising" will be interpreted as an open and inclusive meaning, i.e., "comprising, but not limited to". In the description, the terms "one embodiment", "some embodiments", "exemplary embodiments", "example", "specific example" or "some examples" and the like are intended to indicate that a particular feature, structure, material, or characteristics in connection with the embodiment or example are included in at least one embodiment or example of the present disclosure. The schematic representations of the above terms do not necessarily refer to the same embodiment or example. Furthermore, the particular feature, structure, material, or characteristics may be included in any one or more embodiments or examples in any suitable manner.

In the following, the terms "first", "second" are used for descriptive purposes only and are not to be understood as indicating or implying relative importance or implicitly indicating the number of technical features indicated. Thus, a feature defined by "first" or "second" may explicitly or implicitly include one or more such features. In the description of the embodiments of the present disclosure, "a plurality" means two or more unless otherwise specified.

"At least one of A, B and C" has the same meaning as "at least one of A, B or C," both including the following combination of A, B and C: A alone; B alone; C alone; a combination of A and B; a combination of A and C; a combination of B and C; and a combination of A, B and C.

"A and/or B" includes the following three combinations: A alone; B alone; and a combination of A and B.

"The plurality" means at least two.

The use of "adapted to" or "configured to" herein means an open and inclusive language that does not exclude devices adapted to or configured to perform additional tasks or steps.

In addition, the use of "based on" or "according to" is meant to be open and inclusive in that a process, step, calculation, or other action that is "based on" or "according to" one or more stated conditions or values may in practice be based on additional conditions or exceed the stated values.

As used herein, "about", "approximately" or "substantially" includes the stated value as well as the average value within an acceptable range of deviation for the particular value, as determined by one of ordinary skill in the art in view of the measurement in question and the error associated with measuring the particular quantity (i.e., the limitations of the measurement system).

Example embodiments are described herein with reference to cross-sectional and/or plan views as idealized example figures. In the drawings, thicknesses of layers and regions are exaggerated for clarity. Variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etched region shown as a rectangle will typically have curved features. Thus, the regions illustrated in the figures are schematic in nature and their shapes are not intended to illustrate the actual shape of a region of a device and are not intended to limit the scope of exemplary embodiments.

Embodiments of the present disclosure provide a light-emitting equipment. For example, the light-emitting equipment may be an illumination device, and in this case, the light-emitting equipment serves as a light source to perform an illumination function. For example, the light-emitting equipment may be a backlight module in a liquid crystal display device, a lamp for interior or exterior illumination, or various signal lamps, etc.

As another example, the light-emitting equipment may be a display device for implementing a function of displaying an image (i.e., a screen). The light-emitting equipment may include a display or a product including a display. The display may be a Flat Panel Display (FPD), a micro display, or the like. The display may be a transparent display or an opaque display, if divided depending on whether the user may see the scene behind the display. The display may be a flexible display or a normal display (which may be referred to as a rigid display), if divided depending on whether the display may be bent or rolled. For example, a product containing a display may include: computer displays, televisions, billboards, laser printers with display capability, telephones, cell phones, Personal Digital Assistants (PDAs), laptop computers, digital cameras, camcorders, viewfinders, vehicles, large area walls, monitors, theater screens or stadium signs, and the like.

The light-emitting equipment mainly includes a light-emitting substrate. The light-emitting substrate may be an OLED (Organic Light-Emitting Diode) light-emitting substrate, a QLED (Quantum Dot Light-Emitting Diode) light-emitting substrate, or the like. In the case where the light-emitting equipment is a display device, the light-emitting substrate is a display panel for displaying an image.

In addition, the light-emitting equipment may further include other components, such as, a circuit for supplying an electrical signal to the light-emitting substrate to drive the light-emitting substrate to emit light, which may be referred to as a control circuit and may include a circuit board and/or an IC (Integrated Circuit) electrically connected to the light-emitting substrate; or, a power supply system for supplying power to the light-emitting substrate.

FIG. 1 illustrates a top view of a light-emitting substrate 100 provided by some embodiments of the present disclosure, wherein the light-emitting substrate 100 includes a plurality of sub-pixels P, each of which includes a plurality of components which are mutually coupled to each other. For example, one sub-pixel may include one light-emitting device E and a pixel driving circuit M for controlling the light-emitting device E to emit light, so that each sub-pixel may emit light. One light-emitting device may include two electrodes (for example, an anode and a cathode) and a multi-layered light-emitting functional material disposed between the two electrodes.

In some embodiments, the plurality of sub-pixels in the light-emitting substrate 100 may include a first sub-pixel, a second sub-pixel, and a third sub-pixel, which emit light of different colors. For example, the colors of light emitted by the three sub-pixels in a light-emitting substrate may be three primary colors of light: red (R), green (G), and blue (B). Here, for convenience of description, the sub-pixels emitting light of red (R), green (G), and blue (B) colors in the light-emitting substrate 110 are referred to as an R sub-pixel, a G sub-pixel, and a B sub-pixel, respectively.

FIG. 2 illustrates a partial cross-sectional view of a light-emitting substrate 100 provided by some embodiments of the present disclosure. The light-emitting substrate 100 mainly includes a base substrate 110, a pixel defining layer 120, a first electrode layer 130, and a light-emitting functional layer 140. In addition, the light-emitting substrate 100 may further include a circuit layer disposed on the base substrate 110 and an encapsulation layer 170 (see FIG. 4)

that protects other structures of the light-emitting substrate 100; wherein the circuit layer may include, for example, a plurality of pixel driving circuits.

The base substrate 110 provides a base for other structures in the light-emitting substrate 100, and the structures in the light-emitting substrate 100, such as the pixel defining layer 120, the first electrode layer 130, and the light-emitting functional layer 140, may be formed on the base substrate 110. The base substrate 110 may be either rigid or flexible. Where the base substrate 110 is a rigid base substrate, a material for forming the rigid base substrate may be glass; and where the base substrate 110 is a flexible base substrate, a material for forming the flexible base substrate may be PI (polyimide), PET (polyethylene terephthalate), ultra-thin glass, or the like.

The pixel defining layer 120 is arranged to define a position of the light-emitting device in each sub-pixel in the light-emitting substrate 100, and further, to define a shape and a size of a light-emitting region of each light-emitting device.

The pixel defining layer 120 is disposed on the base substrate 110, and the pixel defining layer 120 has a plurality of opening portions. The opening portion of the pixel defining layer 120 refers to a void (or a through hole) generated in the pixel defining layer 120 after a part of the material of the pixel defining layer 120 is removed. A shape and a size of each opening portion of the pixel defining layer 120 may be arranged as needed. For example, where shapes and sizes of all opening portions of the pixel defining layer 120 are the same, the pixel defining layer 120 may form a uniform mesh structure; further, for example, an opening portion corresponding to the B sub-pixel is larger than an opening portion corresponding to the R sub-pixel, and the opening portion corresponding to the R sub-pixel is larger than an opening portion corresponding to the G sub-pixel. Further, since the pixel defining layer 120 has a certain thickness h, one opening portion of the pixel defining layer 120 may include an upper opening 120a and a lower opening 120b distributed in a thickness direction thereof. Edges of the upper opening 120a and the lower opening 120b may be substantially the same, for example, the upper opening 120a of the pixel defining layer 120 has a size larger than a size of the lower opening 120b, and the upper opening 120a and the lower opening 120b have substantially the same shape. For example, referring to FIG. 2, distances between all points of an edge of an orthographic projection of the upper opening 120a of the opening portion of the pixel defining layer 120 on the base substrate 110 and corresponding points of an edge of an orthographic projection of the lower opening 120b on the base substrate 110 are substantially equal to each other. In addition, one opening portion of the pixel defining layer 120 further includes a sidewall 120c between the upper opening 120a and the lower opening 120b.

The first electrode layer 130 is disposed on the base substrate 110, and includes a plurality of first electrodes 131. At least a part of each first electrode 131 is exposed to one opening portion and constitutes an accommodating portion 150 with the opening portion. The electrode may be an anode or a cathode in the light-emitting device. For example, in the light-emitting substrate 100, the first electrode 131 is an anode.

For example, referring to FIG. 2, the first electrode layer 130 may partially overlap the pixel defining layer 120 in a thickness direction of the light-emitting substrate. That is, an orthogonal projection of the first electrode layer 130 on the base substrate partially overlaps an orthogonal projection of the pixel defining layer 120 on the base substrate. An orthogonal projection of a pattern layer (e.g., the first electrode layer 130, the pixel defining layer 120, etc.) on the base substrate refers to a projection of the pattern layer on the base substrate 110 along the thickness direction of the light-emitting substrate 100. Each first electrode 131 of the first electrode layer 130 may be located on a side of the lower opening 120b of the pixel defining layer 120 close to the base substrate 110. That is, in the process of manufacturing the light-emitting substrate 100, the first electrode layer 130 is formed first, and then the pixel defining layer 120 is formed. One part of the first electrode 131 may be located inside an edge of the lower opening 120b, the other part of the first electrode 131 may be located outside the edge of the lower opening 120b. An surface of the other part of the first electrode 131 outside the edge of the lower opening 120b, on a side of the first electrode 131 away from the base substrate, is covered by the pixel defining layer 120, and the one part of the first electrode 131 inside the edge of the lower opening 120b is exposed to the opening portion and constitutes the accommodating portion 150 with the sidewall 120c of the opening portion. The accommodating portion 150 has a space to accommodate the light-emitting functional material.

Figure 5:
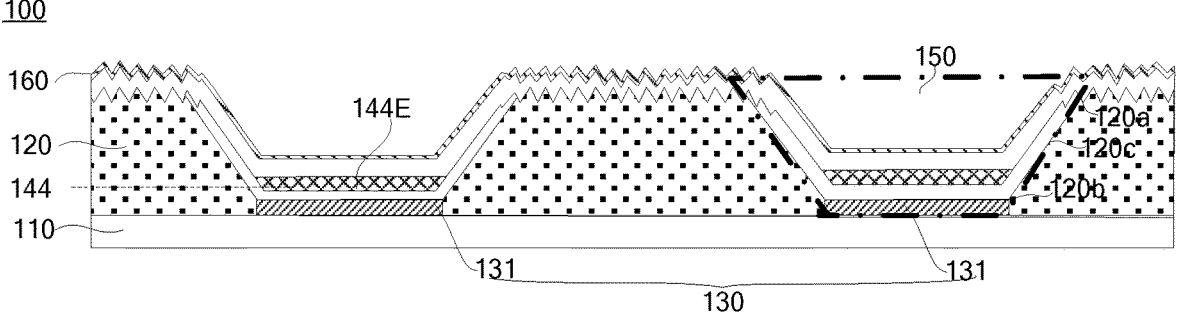
FIG. 5 is a cross-sectional view of yet another light-emitting substrate provided by some embodiments of the present disclosure.

Also for example, the first electrode layer 130 may not overlap the pixel defining layer 120 in a thickness direction of the light-emitting substrate, i.e., an orthogonal projection of the first electrode layer 130 on the base substrate does not overlap an orthogonal projection of the pixel defining layer 120 on the base substrate. Referring to FIG. 5, the first electrode 131 of the first electrode layer 130 may be located completely within an edge of one lower opening 120b of the pixel defining layer 120, i.e., the edge of the first electrode 131 coincides with the lower opening 120b. For example, in the process of manufacturing the light-emitting substrate 100, the pixel defining layer 120 may be formed firstly, and then the first electrode layer 130 may be formed. The first electrode 131 is entirely exposed in the opening portion, and constitutes an accommodating portion 150 with the sidewall 120c of the opening portion.

Figure 6:
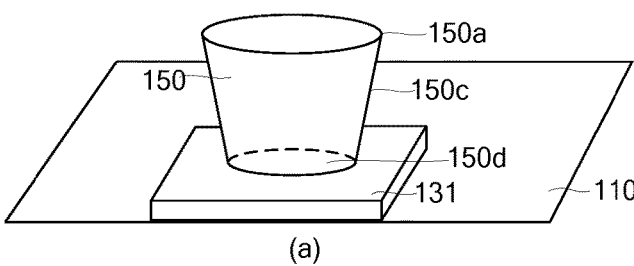
FIG. 6 is a schematic view illustrating an accommodating portion provided by some embodiments of the present disclosure.
Figure 6:
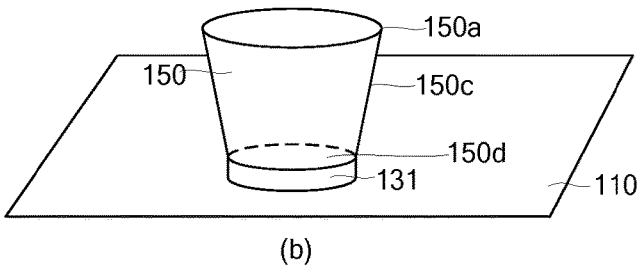

The sidewall 120c of the opening portion may define a surface of an accommodating portion 150 together with a surface of the first electrode 131 exposed in the opening portion away from the base substrate 110. Referring to FIG. 6, a surface of the accommodating portion 150 includes a sidewall 150c and a bottom surface 150d. Part (a) in FIG. 6 shows the accommodating portion 150 formed when the first electrode layer 130 is formed first and then the pixel defining layer 120 is formed in the process of manufacturing the light-emitting substrate 100; part (b) in FIG. 6 shows the accommodating portion 150 formed when the pixel defining layer 120 is formed first and then the first electrode layer 130 is formed in the process of manufacturing the light-emitting substrate 100. In addition, the accommodating portion 150 also includes an upper opening 150a.

Figure 3:
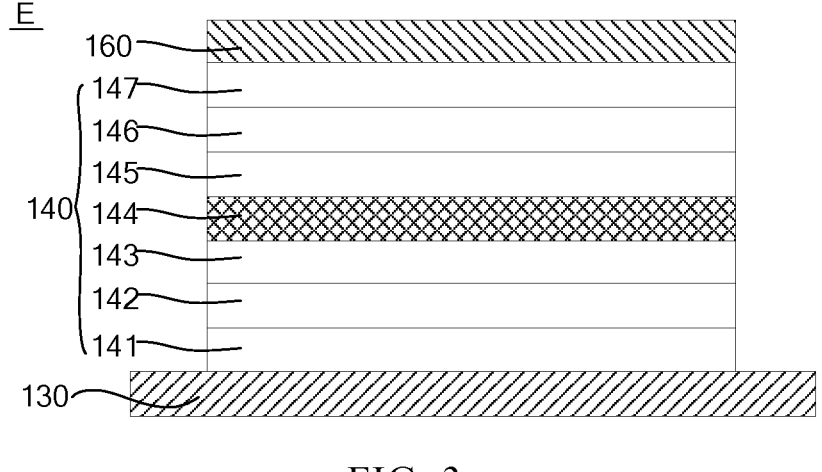
FIG. 3 is a schematic view of a portion E of the light-emitting substrate shown in FIG. 2.

The light-emitting functional layer 140 is a main structure of the light-emitting substrate 100 to realize a light-emitting function, and the light-emitting functional layer 140 includes a plurality of functional sub-layers. The functional sub-layer may be a thin film mainly formed of an organic material, which may be used to emit light or to assist light emission. For example, referring to FIGS. 3 and 4, in the OLED light-emitting substrate, the plurality of functional sub-layers may include a emission layer 144 and may further include: a hole injection layer 141, a hole transport layer 142, a light-emitting prime layer 143, an electron injection layer 147, an electron transport layer 146, and a hole block layer 145. The emission layer 144 is a film layer that actually emits light, the light-emitting material for fabricating the emission layer may be excited under the energy generated by the recombination of holes and electrons, such that light is emitted by radiation. The light of different colors corresponds to different light-emitting materials. For example, the material for emitting blue light may be 9-(1-naphthyl)-10-(2-naphthyl) anthracene and its derivatives and may be doped with blue fluorescent material. The material for emitting red light or green light may be made by co-evaporation or premixed evaporation of double main body materials. That is, the material for emitting red light or green light is composed of two materials with hole transport function and electron transport function, wherein the hole type material is usually carbazole and derivatives thereof, and the electron type material is usually triazine derivatives; the hole injection layer 141 and the hole transport layer 142 are used to inject and transport holes respectively; the hole injection layer 141 may be made of a p-type doped material, for example, 2,3,5,6-tetrafluoro-7,7',8,8'-tetracyanoquinodimethane (F4-TCNQ) is doped into the hole transport material to form a hole injection layer; and the hole transport layer 142 may be made of a material having a high hole mobility, which is, for example, a low molecular material of the family of aromatic amines and dendrimers, such as N'-bis (1-naphthyl)-1,1'-biphenyl-4,4'-diamine (NPB), 1'-biphenyl-4,4'-diamine (TPD), or the like. The electron injection layer 147 and the electron transport layer 146 are used to inject and transport electrons respectively, wherein the material of the electron transport layer 146 is typically an aromatic compound having a large conjugated plane such as an oxazole derivative, an oxadiazole derivative, a triazole derivative, or the like; the electron injection layer may adopt a metal or inorganic materials with better injection performance, such as Yb, Li, LiF and the like; the light-emitting prime layer 143 and the hole block layer 145 may be used to block the transport of electrons and holes toward a specific direction, respectively; the material of the light-emitting prime layer is similar to the hole transport type material, but has a deeper HOMO level and LUMO level; and the material of the hole block layer is similar to the electron transport type material, but has a shallower HOMO level and LUMO level.

In addition, in the OLED light-emitting substrate, the light-emitting functional layer 140 may further include only some of the functional sub-layers. For example, the light-emitting functional layer 140 may include: the emission layer 144; some of the hole injection layer 141, the hole transport layer 142, and the light-emitting prime layer 143, here the number of layers being not limited as long as the hole injection function and the hole transport function may be achieved; some of the electron injection layer 147, the electron transport layer 146, and the hole block layer 145, here the number of layers being not limited as long as the electron injection function and the electron transport function may be achieved. For example, the light-emitting functional layer 140 includes: the hole injection layer 141, the hole transport layer 142, the emission layer 144, the electron injection layer 147, and the electron transport layer 146. That is, the light-emitting functional layer 140 is formed as a five-layer structure.

The light-emitting functional layer 140 includes the plurality of functional sub-layers, wherein a functional sub-layer may include a plurality of discontinuous functional patterns or a continuous whole layer. When a functional sub-layer is not a continuous whole-layer structure, the functional sub-layer may be divided into a plurality of discontinuous "blocks" with a specific shape, and each "block" is referred to as a functional pattern. The functional patterns of the functional sub-layer may be located in one accommodating portion 150. For example, one functional pattern is completely located in one accommodating portion 150, see (a) and (b) of FIG. 7. Alternatively, one functional pattern is only partially located within one accommodating portion 150, see (c) of FIG. 7.

The light-emitting functional layer 140 is disposed on a side of the first electrode layer 130 away from the base substrate 110. Specifically, the light-emitting functional layer 140 may be disposed on a side of the pixel defining layer 120 and the first electrode layer 130 away from the base substrate 110, and overlaps at least a part of the pixel defining layer 120 and at least a part of the first electrode layer 130 in a thickness direction of the light-emitting substrate 100. For example, in the thickness direction of the light-emitting substrate 100, the light-emitting functional layer 140 may overlap the sidewall 120c of the opening portion of the pixel defining layer 120 and a part of the first electrode layer 130. For example, referring to FIG. 2, all functional sub-layers of the light-emitting functional layer 140 include functional patterns which are completely located in the accommodating portion 150, covering the surface of the accommodating portion 150; as another example, in the thickness direction of the light-emitting substrate 100, the light-emitting functional layer 140 may also overlap the sidewall 120c of the opening portion of the pixel defining layer 120, a surface of the pixel defining layer 120 away from the base substrate 110, and a part of the first electrode layer 130. For example, referring to FIG. 5, functional sub-layers of the light-emitting functional layer 140 located below the emission layer 144 include functional patterns which are completely located in the accommodating portion 150, and the functional sub-layers of the light-emitting functional layer 140 located above the emission layer 144 are each a continuous whole-layer structure that completely covers the surface of the accommodating portion 150 and the surface of the pixel defining layer 120 away from the base substrate 110.

The plurality of functional sub-layers in the light-emitting functional layer 140 include at least one first functional sub-layer, wherein each first functional sub-layer includes a plurality of functional patterns. The functional patterns in the first functional sub-layer have the following characteristics: each of the functional patterns is located in one accommodating portion 150, and is conformal to a surface of the accommodating portion 150, and a distance from an edge of the functional pattern to the base substrate 110 is smaller than or equal to a distance from an edge of a sidewall of the accommodating portion 150 to the base substrate 110. That is, among the plurality of functional sub-layers, a functional sub-layer having these characteristics is referred to as a first functional sub-layer.

Figure 7:
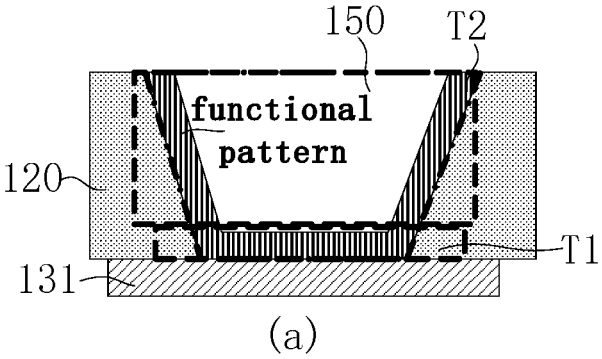
FIG. 7 is a schematic view of a functional pattern provided by some embodiments of the present disclosure.
Figure 7:
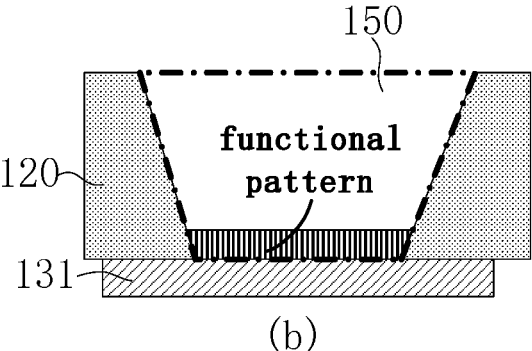
Figure 7:
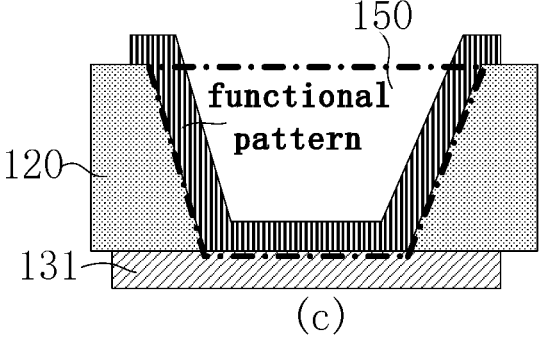

The functional pattern being conformal to the surface of the accommodating portion 150 refer to: referring to (a) of FIG. 7, one functional pattern is completely located in one accommodating portion 150. The functional pattern includes a first sub-pattern T1 and a second sub-pattern T2; the first sub-pattern T1 is substantially parallel to the bottom surface 150d of the accommodating portion 150, and the second sub-pattern T2 is substantially parallel to the sidewall 150c of the accommodating portion 150. Such a functional pattern is conformal to the surface of the accommodating portion 150. For example, referring to (a) of FIG. 7, the functional pattern conformal to the surface of the accommodating portion 150 may completely cover the surface of the accommodating portion 150.

For convenience of distinguishing functional patterns in the embodiments of the present disclosure, a functional pattern having the above-described characteristics is referred to as the first functional pattern, that is, the first functional pattern is located in one accommodating portion 150, is conformal to the surface of the accommodating portion 150, and the distance from the edge of the first functional pattern to the base substrate 110 is smaller than or equal to the distance from the edge of the accommodating portion 150 to the base substrate 110.

The first functional sub-layer refers to a functional sub-layer including the first functional pattern. For example, referring to FIG. 5, in the light-emitting substrate 100, a functional sub-layer of the light-emitting functional layer 140 located below the emission layer is a first functional sub-layer.

In the embodiment of the present disclosure, since the first functional patterns included in the first functional sub-layers are completely located in the accommodating portion 150, such that adjacent first functional patterns in one first functional sub-layer are separated by the material of the pixel defining layer 120, the first functional patterns are not connected to each other. The material of the pixel defining layer 120 is insulating, and thus, the current for controlling the light emission intensity in one sub-pixel cannot pass through the first functional sub-layer to the adjacent sub-pixels, so that the first functional sub-layer may be used to solve the problem of light emission crosstalk between adjacent sub-pixels.

In some embodiments, the first functional sub-layer may be any one functional sub-layer in the light-emitting functional layer 140. For example, the first functional sub-layer may be the hole injection layer 141, the hole transport layer 142, the light-emitting prime layer 143, the hole block layer 145, the electron transport layer 146, the electron injection layer 147, or the emission layer 144.

Figure 4:
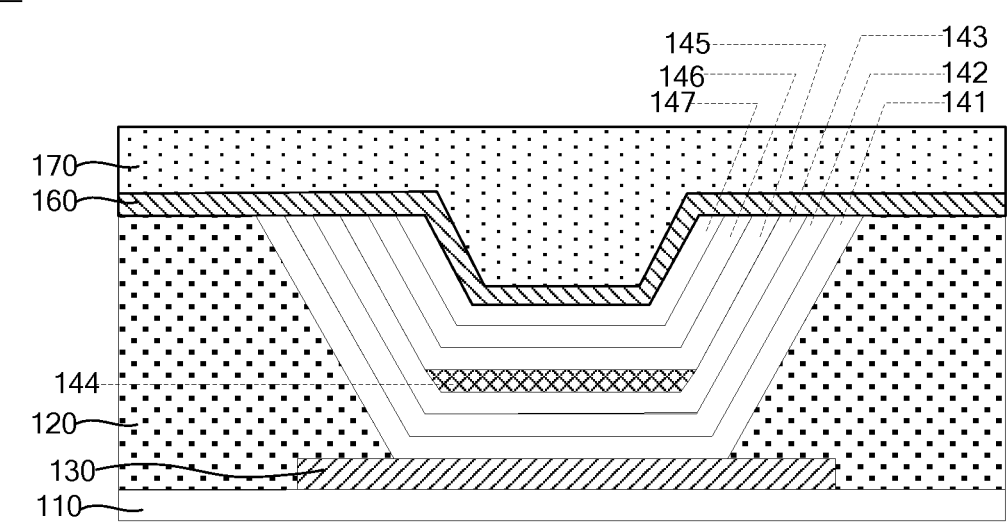
FIG. 4 is a cross-sectional view of another light-emitting substrate provided by some embodiments of the present disclosure.

In some embodiments, each of the at least two functional sub-layers in the light-emitting functional layer 140 is a first functional sub-layer. Each of the hole injection layer 141 and the emission layer 144 in the light-emitting functional layer 140 is, for example, a first functional sub-layer. Alternatively, each of the hole injection layer 141, the hole transport layer 142, and the light-emitting prime layer 143 in the light-emitting functional layer 140 is a first functional sub-layer. Alternatively, as shown in FIG. 4, each of the functional sub-layers except the emission layer 144 in the light-emitting functional layer 140 is a first functional sub-layer. Since the material of the hole injection layer 141 is a p-type doped material similar to a conductor, where the hole injection layer 141 in the light-emitting functional layer 140 is a first functional sub-layer, the problem of light emission crosstalk between adjacent sub-pixels in the light-emitting substrate 100 may be solved to the greatest extent. In addition, since the materials for manufacturing the light-emitting prime layer 143 and the emission layer 144 are also conductive, where the light-emitting prime layer 143 and the emission layer 144 are also the first functional sub-layer, the problem of light emission crosstalk in the light-emitting substrate 100 may be further improved.

Figure 8:
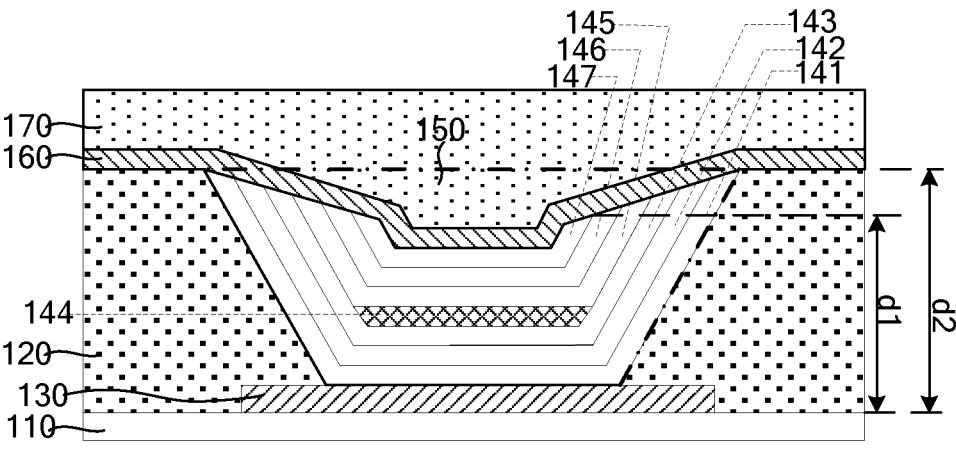
FIG. 8 is a cross-sectional view of yet another light-emitting substrate provided by some embodiments of the present disclosure.

In some embodiments, for the light-emitting substrate 100 including at least two first functional sub-layers, among the functional patterns (i.e., the first functional patterns) disposed in the same accommodating portion 150, a distance from an edge of a first functional pattern farthest from the base substrate 110 to the base substrate 110 is smaller than a distance from an edge of a first functional pattern closest to the base substrate 110. Referring to FIG. 8, for example, a distance d1 from an edge of a first functional pattern in the electron injection layer 147 to the base substrate 110 is smaller than a distance d2 from an edge of a first functional pattern in the hole injection layer 141 to the base substrate 110.

In some embodiments, for the light-emitting substrate 100 including at least two first functional sub-layers, in every two adjacent functional patterns (i.e., the first functional patterns) disposed in the same accommodating portion 150, a distance from an edge of a first functional pattern farther away from the base substrate 110 to the base substrate 110 is smaller than a distance from an edge of a first functional pattern closer to the base substrate 110 to the base substrate 110. For example, the light-emitting functional layer 140 includes a plurality of first functional sub-layers, and the first functional patterns in one accommodating portion 150 form a slope at the upper opening 120a of the accommodating portion 150. For example, referring to FIG. 8, each functional sub-layer in the light-emitting functional layer 140 is a first functional sub-layer except for the emission layer 144; and in one accommodating portion 150, in a direction from a first functional sub-layer (hole injection layer 141) closest to the base substrate 110 to a first functional sub-layer (electron injection layer 147) farthest from the base substrate 110, a distance from an edge of the first functional pattern of each first functional sub-layer to the base substrate 110 becomes smaller and smaller, so that the edges of the first functional patterns in one accommodating portion 150 form a slope at the upper opening 150a of the accommodating portion 150.

In other embodiments, referring to FIG. 4, the edges of the first functional patterns in one accommodating portion 150 are substantially flush, and a distance from an edge of each first functional pattern to the base substrate 110 is constant.

In some embodiments, referring to FIG. 5, the plurality of functional sub-layers in the light-emitting functional layer 140 include: the emission layer 144 including a plurality of light-emitting patterns 144E, each light-emitting pattern 144E is located in one accommodating portion 150; at least one first functional sub-layer arranged on a side of the emission layer 144 close to the base substrate 110; and at least one first functional sub-layer arranged on a side of the emission layer 144 away from the base substrate 110. In the same accommodating portion 150, the first functional patterns of the first functional sub-layers arranged on both sides of the emission layer 144 wrap the light-emitting pattern 144E.

The light-emitting pattern 144E refers to a functional pattern of the emission layer 144, which may be the same as any one of the forms of the functional patterns shown in FIG. 7. Referring to FIG. 4, where the light-emitting pattern 144E is entirely located in the accommodating portion 150 and includes only a part parallel to the first electrode 131, the first functional patterns of the first functional sub-layers arranged on two opposite sides of the light-emitting pattern 144E may completely wrap the light-emitting pattern 144E. There may be more than one first functional sub-layers disposed on two opposite sides of the emission layer 144 in the above embodiments. For example, referring to FIG. 4, there are three first functional sub-layers on each of two opposite sides of the light-emitting pattern 144E, respectively.

In other embodiments, all of the functional sub-layers in the light-emitting functional layer 140 are the first functional sub-layers. For example, on the basis of FIG. 4, the light-emitting pattern in the emission layer 144 may be changed to be conformal to the surface of the accommodating portion 150. Where all the functional sub-layers in the light-emitting functional layer 140 are the first functional sub-layers, the current for controlling the light-emitting intensity in one sub-pixel cannot be transmitted to the adjacent sub-pixels through the light-emitting functional layer 140, so that the problem of light emission crosstalk caused by the light-emitting functional layer 140 is completely solved.

In some embodiments, referring to FIGS. 2 to 5, the light-emitting substrate 100 further includes a second electrode layer 160 positioned on a side of the light-emitting functional layer 140 away from the base substrate 110, and the second electrode layer 160 is conformal to surfaces of the light-emitting functional layer 140 and the pixel defining layer 120 away from the base substrate 110. The second electrode layer 160 may be a continuous whole-layer structure, and is disposed oppositely to the first electrode layer 130, so that the light-emitting functional layer 140 is located between the first electrode layer 130 and the second electrode layer 160. The second electrode layer 160 is disposed adjacent to the light-emitting functional layer 140 and the pixel defining layer 120, and a shape of a surface of the second electrode layer 160 is similar to that of the light-emitting functional layer 140 and the pixel defining layer 120 away from the base substrate 110, so that there is hardly a gap between the second electrode layer 160 and the light-emitting functional layer 140 and the pixel defining layer 120. For example, where surfaces of the light-emitting functional layer 140 and the pixel defining layer 120 away from the base substrate 110 are uneven, both the upper and lower surfaces of the second electrode layer 160 are uneven, and the upper and lower surfaces of the second electrode layer 160 are conformal to the surfaces of the light-emitting functional layer 140 and the pixel defining layer 120 away from the base substrate 110. For example, at the convex of the surface of the pixel defining layer 120, the upper and lower surfaces of the second electrode layer 160 are also convex.

In some embodiments, referring to FIGS. 2 and 5, a surface (i.e., an upper surface, not including the sidewall of the opening portion) on a side of the pixel defining layer 120 away from the base substrate 110 is uneven. The uneven surface has a greater surface area compared to a smooth surface. In the case where the encapsulation layer 170 is disposed in the light-emitting substrate 100, for example, with reference to FIGS. 2 and 5, where the surface on the side of the pixel defining layer 120 away from the base substrate 110 is uneven, the surface of the second electrode layer 160 formed thereon is also uneven; the encapsulation layer 170 may be disposed on the uneven surface of the second electrode layer 160; and the uneven surface of the second electrode layer 160 may increase a contact area with the encapsulation layer 170, so that the second electrode layer 160 is encapsulated by the encapsulation layer 170 more tightly, and the encapsulation layer 170 may perform better barrier and protection effects on the entire light-emitting substrate 100.

In some embodiments, referring to FIG. 2 and FIG. 5, the uneven surface on the side of the pixel defining layer 120 away from the base substrate 110 has a plurality of strip-shaped grooves, wherein sizes of the plurality of strip-shaped grooves may be different from each other, and the arrangement of the plurality of strip-shaped grooves may also be adjustable. For example, the surface on the side of the pixel defining layer 120 away from the base substrate 110 has a plurality of strip-shaped grooves parallel to each other.

Further, a cross section of the strip-shaped groove may be a geometric figure. For example, the cross section of the strip-shaped groove is a polygon. For example, the cross section of the strip-shaped groove is a triangle.

In some embodiments, referring to FIG. 8, an edge of a functional pattern of the first functional sub-layer is uneven in the thickness direction of the light-emitting substrate 100. For example, distances from respective points on the edge of one functional pattern (i.e., the first functional pattern) in one accommodating portion 150 to the base substrate 110 may be different. For example, in the first functional pattern shown in FIG. 8, the edge of each first functional pattern is sloped in the thickness direction of the light-emitting substrate 100. For example, referring to FIG. 5, the edge of the first functional pattern in the accommodating portion 150 is uneven, such as zigzag, in the thickness direction of the light-emitting substrate 100.

An embodiment of the present disclosure provides a manufacturing apparatus 200 for a light-emitting substrate 100. The manufacturing apparatus 200 is configured to manufacture the light-emitting functional layer 140 in the light-emitting substrate 100. The manufacturing apparatus includes at least one material removal assembly 210, each material removal assembly 210 including a support part 211 and a material removal layer 212 disposed on a surface of the support part 211, the material removal layer 212 being configured to adsorb or adhere at least one material in the light-emitting functional layer 140.

The material removal assembly 210 may be a device having an adsorption or adhesion function, and the material removal assembly 210 may be, for example, an adsorption plate, an adsorption strip, or the like. The material removal assembly 210 is configured to adsorb or adhere an organic material at a specific position in the light-emitting substrate 100 during the manufacturing process of the light-emitting substrate 100. For example, the material removal assembly 210 may be configured to adsorb or adhere the material of the light-emitting functional layer 140 located outside the accommodating portion 150.

The support part 211 provides structural support for the material removal assembly 210. For example, where the material removal assembly 210 is an adsorption plate, the support part 211 may be a rigid plate having a certain thickness.

The material removal layer 212 may be made of a material having adsorptivity or viscosity, for adsorbing or adhering the organic material in the light-emitting functional layer 140. In addition, the material removal layer 212 may be made of other materials, as long as a bonding force between the material of the material removal layer 212 and the material of the light-emitting functional layer 140 is greater than the bonding force between the material of the light-emitting functional layer 140 and the material of the pixel defining layer 120 so that the material of the light-emitting functional layer 140 may be removed.

In the light-emitting substrate 100, when the material of the functional sub-layer in the light-emitting functional layer 140 is partially located outside the accommodating portion 150, for example, as shown in FIG. 5 or (c) of FIG. 7, the manufacturing apparatus 200 may be used to remove the material of the functional sub-layer located outside the accommodating portion 150, so that the functional pattern of the functional sub-layer formed after the removal is completely located inside the accommodating portion 150. For example, the functional pattern after the removal is the first functional pattern, and the functional sub-layer after the removal is the first functional sub-layer.

When manufacturing the light-emitting functional layer 140 of the light-emitting substrate 100, the first functional sub-layer may be manufactured by using the manufacturing apparatus 200, and the functional patterns of the first functional sub-layers are not connected to each other, so that it may be ensured that the current of respective sub-pixels does not cause crosstalk. Also, the manufacturing apparatus 200 for the light-emitting substrate 100 includes the material removal assembly 210 mainly composed of the support part 211 and the material removal layer 212. The material removal assembly 210 has a simple structure, and a fine structure of a sub-pixel size level is not required to be provided on the adsorption member, so that the manufacturing cost for the light-emitting substrate 100 is low compared to a fine mask.

In some embodiments, the material removal assembly 210 is a roller assembly. The support part 211 in the roller assembly is a roller, and the material removal layer 212 coats the roller along a circumference of the roller.

Figure 9:
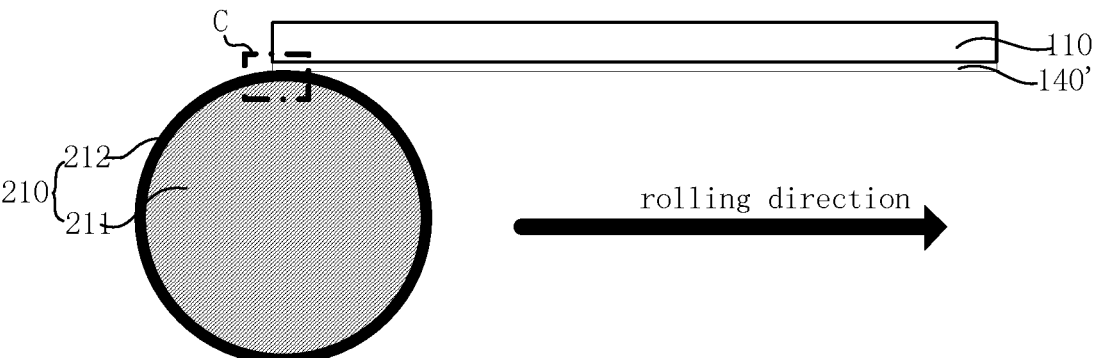
FIG. 9 is a schematic view illustrating how to form a light-emitting functional layer of a light-emitting substrate by using a manufacturing apparatus provided by some embodiments of the present disclosure.

For example, the roller may be a member or mechanism capable of rolling on a flat surface, and the rolling path may form a flat surface. For example, the roller is a cylinder, and the rolling path thereof may cover a surface of the light-emitting substrate 100. The material removal layer 212 is disposed on a rolling surface of the roller. For example, where the roller is a cylinder, the material removal layer 212 may be disposed at a side of the cylinder. Referring to FIG. 9, when the roller rolls along a surface of the light-emitting substrate 100, the material removal layer 212 may continuously contact different regions of the surface.

In some embodiments, the manufacturing apparatus 200 includes a plurality of roller assemblies, radiuses of which are the same and rotation axes of the rollers are parallel to each other. In addition, the manufacturing apparatus 200 further includes a connecting member 220, which is connected to each roller at a position on the rotation axis of the roller.

Figure 10:
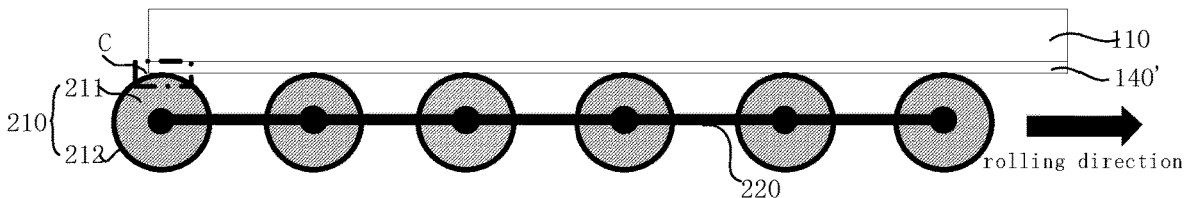
FIG. 10 is a schematic view illustrating how to form a light-emitting functional layer of a light-emitting substrate by using another manufacturing apparatus provided by some embodiments of the present disclosure.

For example, referring to FIG. 10, the plurality of roller assemblies are connected by the connecting member 220. The radiuses of the roller assemblies are the same and the connecting member 220 is connected to each roller at a position on the rotation axis of the roller, such that each roller assembly connected may also roll along a certain path and the material removal layer 212 of each roller assembly may also contact the rolling surface thereof. However, the material removal layers 212 of respective roller assemblies may be different from each other. For example, the material removal layers 212 of respective roller assemblies are made of different materials.

In the manufacturing apparatus 200 composed of the plurality of roller assemblies, moving paths of respective roller assemblies are the same. For example, a first roller assembly located at the head (the first roller assembly arranged in a rolling direction) rolls through a path, a second roller assembly rolls through the same path again, and so on. When manufacturing the light-emitting functional layer of the light-emitting substrate 100 by using the manufacturing apparatus 200 composed of the plurality of roller assemblies, the light-emitting substrate 100 may be adsorbed several times at a same position, so that the adsorption completion degree may be improved, a better adsorption effect may be achieved, and the adsorption time may be reduced, thereby improving the adsorption efficiency.

In some embodiments, the material of the material removal layer 211 is one of porous ceramic, optical adhesive, and silica gel. The porous ceramic material is generally manufactured by calcining metal oxide, silicon dioxide, silicon carbide and the like, and has a good adsorbability, and may be repeatedly used by being washed by a solvent or baked at high temperature. The optical adhesive mainly adheres the organic material through the viscosity of the adhesive material, which may be washed away by a solvent after use, and a new adhesive material may be coated or attached on the support part 211 after drying. The optical adhesive may be, for example, one or more of organic silica gel, acrylate type resin (e.g., optical acrylic adhesive), unsaturated polyester, polyurethane, and epoxy resin, such as polymethacrylate type resin. The silica gel material removes the organic material from the pixel defining layer 120 by adhering with a good combination between the silica gel and the organic material, and may be washed by a suitable solvent, or baked at a high temperature after use, for multiple uses in future.

Figure 11:
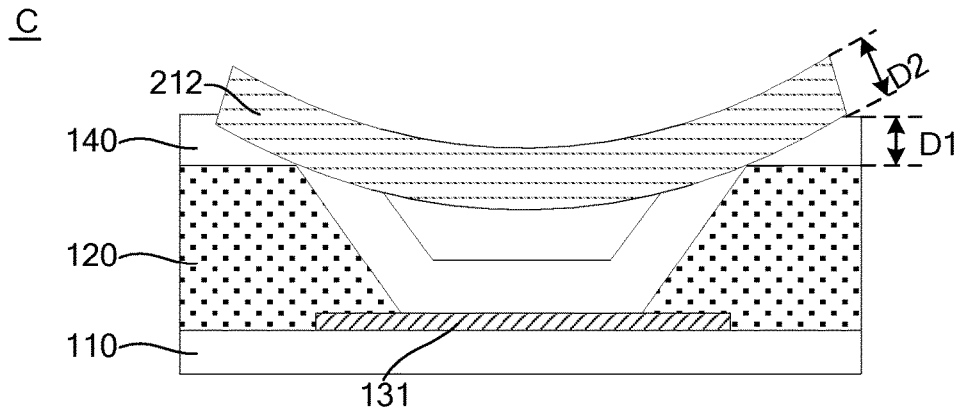
FIG. 11 is an enlarged view of a portion C in FIG. 9.

In some embodiments, referring to FIG. 11, a thickness D2 of the material removal layer 211 is greater than or equal to a total thickness D1 of the first functional sub-layers in the light-emitting functional layer 140. Thus, the material of the light-emitting functional layer 140 outside the accommodating portion 150 may be sufficiently wrapped and covered, and a good adsorption effect may be achieved. For example, the thickness D1 of the light-emitting functional layer 140 of the OLED light-emitting substrate usually ranges from 0.3 μm to 0.4 μm, and the thickness D2 of the material removal layer 211 may be set to 0.5 μm. In some embodiments, the material removal layer has a thickness of 0.1 μm to 1 μm.

In some embodiments, a radius of the roller 211 ranges from 1 cm to 10 cm, which may cause a waste of space if too large. In particular, the radius of the roller for manufacturing respective light-emitting substrate 100 needs to be calculated.

Figure 12:
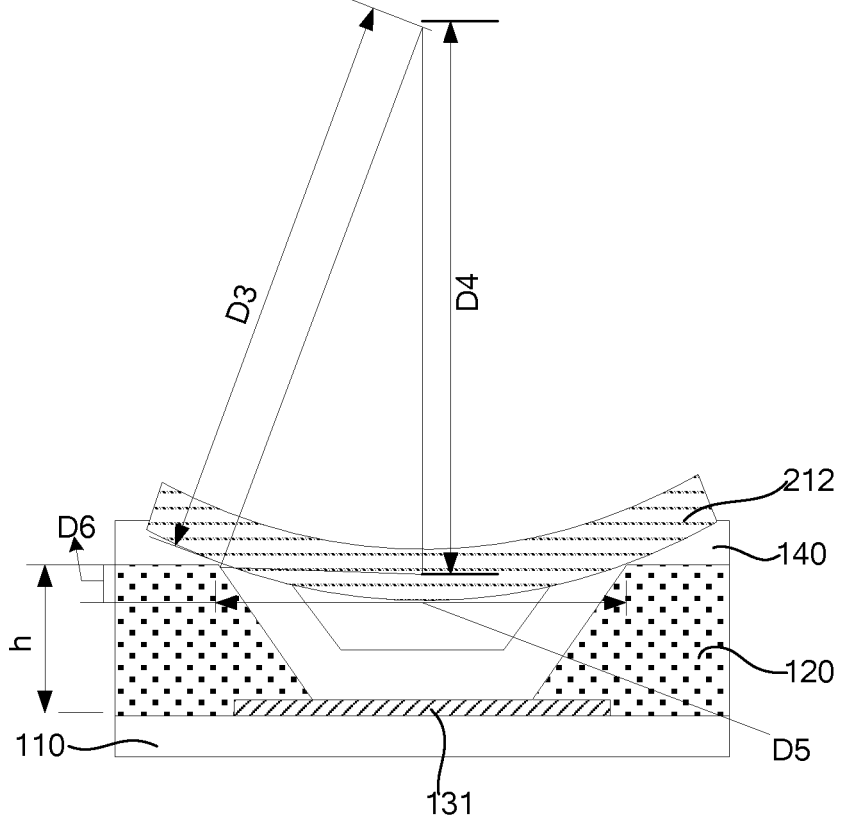
FIG. 12 is a schematic view illustrating sizes in a manufacturing apparatus of a light-emitting substrate provided by some embodiments of the present disclosure.

For example, referring to FIG. 12, a pixel width of a current high resolution mobile phone product usually ranges from 20 μm to 50 μm, and the maximum is not more than 100 μm. Considering the requirements of some low resolution products and the problem that the reduction of a slope angle of the accommodating portion 150 (the minimum is around 10 degrees) causes the upper opening 120_a_ of the pixel defining layer 120 to be larger, a width of the upper opening 120_a_ of the pixel defining layer 120 is not more than 200 μm at the maximum; and then, assuming that the width D5 of the upper opening 120_a_ of the pixel defining layer 120 is 200 μm, the radius D3 of the material removal assembly 210 is 1 cm, i.e. 10000 μm, a distance from a center of a circle to the upper opening 120_a_ of the pixel defining layer 120 is D4, where D$4=\sqrt{10000^2-100^2}$9999. 5 μm, so a height of the material of the material removal layer 212 sagging into the pixel defining layer 120 does not exceed D6, where D6=D3−D4=0.5 μm. That is, the height of the material of the material removal layer 212 sagging into the pixel defining layer 120 does not exceed 0.5 μm. A thickness of the light-emitting functional layer 140 is not more than 0.5 μm at the maximum, so where the thickness h of the pixel defining layer 120 is more than 1 μm, the material removal layer 212 does not affect the functional patterns in the accommodating portion 150. When the thickness of the pixel defining layer 120 is required to be reduced according to a specific requirement, the radius of the roller 211 may be increased appropriately.

By setting the size of the material removal assembly 210 as above, when the material removal assembly 210 rolls across the light-emitting substrate 100, the organic material between the accommodating portions 150 may be absorbed and carried away by the material removal assembly 210, and the material of the light-emitting functional layer 140 in the accommodating portion 150 cannot be carried away by the material removal layer 212, so that the normal function of the light-emitting substrate 100 is not affected.

Figure 13:
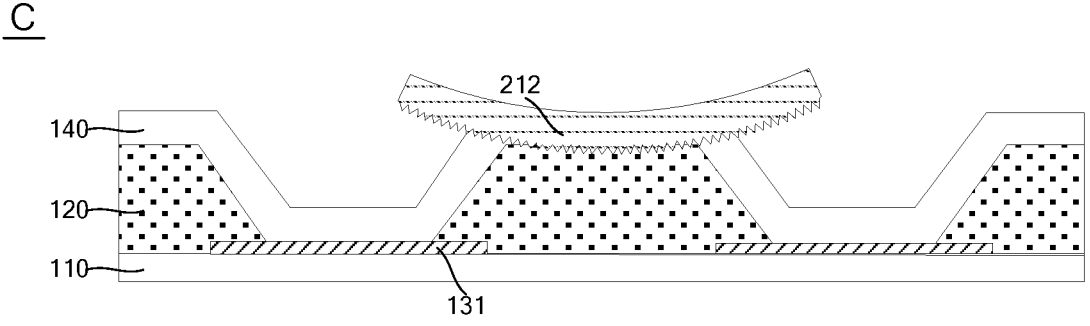
FIG. 13 is a schematic view illustrating how to form a light-emitting functional layer of a light-emitting substrate by using yet another manufacturing apparatus provided by some embodiments of the present disclosure.

In some embodiments, a surface of the material removal layer 212 away from roller 211 is uneven. For example, the surface of the material removal layer 212 away from the roller 211 has a plurality of strip-shaped protrusions parallel to each other. For example, see FIG. 13, a cross-section of a strip-shaped protrusion is triangular. When the surface of the material removal layer 212 away from the roller 211 is uneven, the material removal layer 212 may more fully contact the light-emitting functional layer 140, and thus, incomplete adsorption or adsorption of only one layer of organic material on the surface is avoided. Meanwhile, the uneven surface may form fine and continuous pits on the pixel defining layer 120, so that even if organic materials which are not completely adsorbed are remained on the pixel defining layer 120, the organic materials which are not completely adsorbed are cut off, and thus, the light-emitting current of the adjacent sub-pixels which is transmitted through the functional sub-layers is cut off, and the phenomenon of light emission crosstalk of the adjacent sub-pixels is prevented.

Figure 14:
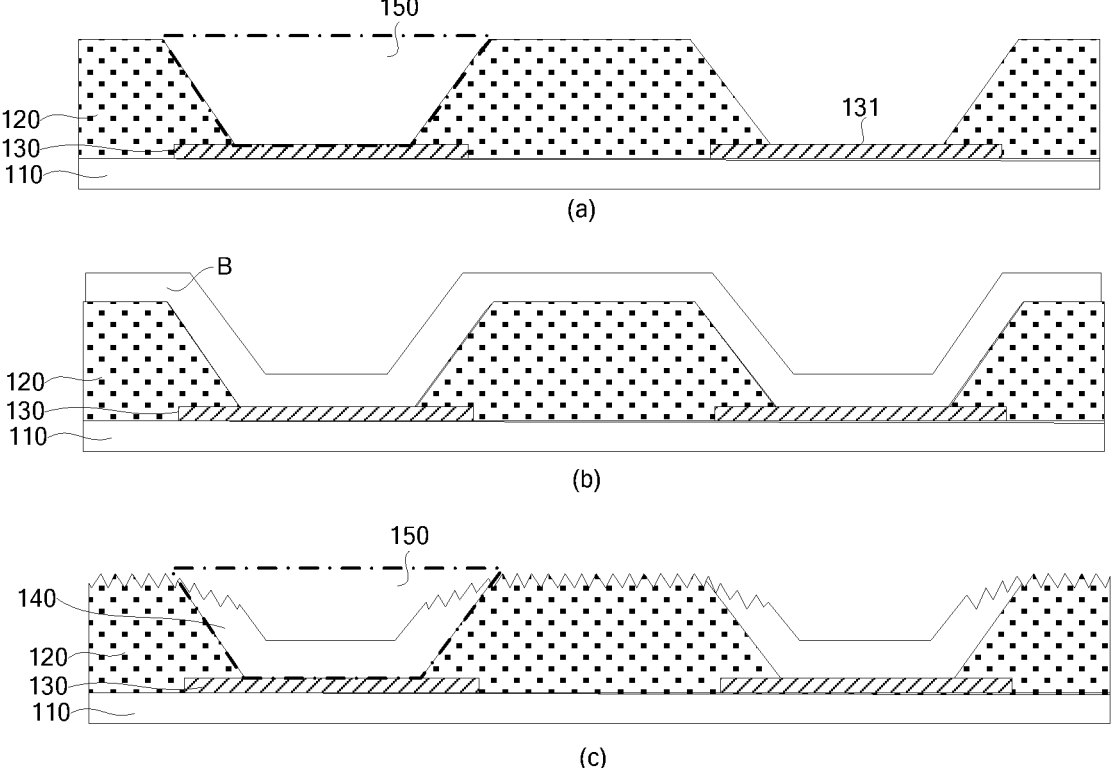
FIG. 14 is a schematic flow chart of a method for manufacturing a light-emitting substrate provided by some embodiments of the present disclosure.

In addition, an embodiment of the present disclosure also provides a method for manufacturing a light-emitting substrate, including:

Firstly, referring to (a) of FIG. 14, a first electrode layer 130 and a pixel defining layer 120 are formed on a base substrate 110, wherein the pixel defining layer 120 has a plurality of opening portions; the first electrode layer 130 includes a plurality of first electrodes 131, and at least a part of each first electrode 131 is exposed to one opening portion and constitutes an accommodating portion 150 with the opening portion.

Next, referring to (b) of FIG. 14, at least one thin film B is formed on the base substrate 110 on which the first electrode layer 130 and the pixel defining layer 120 are formed.

Then, a material removal layer 212 in a manufacturing apparatus 200 is brought into contact with the uppermost thin film of the at least one thin film B, such that the material removal layer 212 in the manufacturing apparatus 200 adsorbs or adheres the material of the at least one thin film B, to form at least one first functional sub-layer. Referring to (c) of FIG. 14, each first functional sub-layer includes a plurality of functional patterns, each functional pattern is located in one accommodating portion 150, and is conformal to the surface of the accommodating portion 150, and a distance from an edge of the functional pattern to the base substrate 110 is smaller than or equal to a distance from an edge of the accommodating portion 150 to the base substrate 110, wherein the at least one first functional sub-layer is included in the light-emitting functional layer 140.

For example, referring to FIGS. 9 and 10, the functional sub-layer 140 of the light-emitting substrate 100 may be downward relative to the base substrate 110 by suction with a suction cup, so as to prevent particles on the material removal assembly 210 from falling onto the light-emitting substrate 100, thereby affecting the production yield of the light-emitting substrate 100, and on the other hand, so as to facilitate the operation, thereby better absorbing the material of the light-emitting functional layer 140 attached between the accommodating portions 150.

For example, in the process of fabricating the OLED light-emitting substrate, the manufacturing apparatus 200 may be disposed in an evaporation cavity of the emission layer 144, or may be separately disposed in a single cavity.

For example, when controlling the manufacturing apparatus 200 for the light-emitting substrate 100 to roll on a thin film to form at least one first functional sub-layer, the thin film may be processed into the first functional sub-layer by using the manufacturing apparatus 200 after forming one layer of the thin film. Furthermore, all of the thin films formed may be processed by using the manufacturing apparatus 200 after forming at least one layer of the thin film.

In the method for manufacturing the light-emitting substrate 100 according to the embodiment of the present disclosure, the first functional sub-layer in the light-emitting functional layer 140 is manufactured by using the manufacturing apparatus 200, and since a fine mask is not required to be used, the cost for manufacturing the light-emitting functional layer 140 with the manufacturing method is greatly reduced.

Finally, it should be noted that: the above examples are only intended to illustrate, not to limit, the technical solution of the present disclosure; although the present disclosure has been described in detail with reference to the foregoing embodiments, it should be understood by one of ordinary skill in the art that: the technical solutions described in the foregoing embodiments may still be modified, or some technical features in the technical solutions may be equivalently substituted; such modifications and substitutions do not bring the essential of respective technical solution depart from the spirit and scope of the technical solutions of the embodiments of the present disclosure.

What is claimed is:

1. A light-emitting substrate comprising:
a base substrate;
a pixel defining layer disposed on the base substrate, the pixel defining layer having a plurality of opening portions, and a part of the pixel defining layer except the plurality of opening portions having substantially a same thickness, with no step shape formed in the part of the pixel defining layer except the plurality of opening portions;
a first electrode layer comprising a plurality of first electrodes, at least a part of each of the first electrodes being exposed to one of the opening portions and constituting an accommodating portion with the opening portion; and
a light-emitting functional layer arranged on a side of the first electrode layer away from the base substrate, the light-emitting functional layer comprising a plurality of functional sub-layers, at least one of which is a first functional sub-layer, the first functional sub-layer comprising a plurality of functional patterns, each of the functional patterns being located in one of the accommodating portions and being conformal to a surface of the accommodating portion, and a distance from an edge, in a direction parallel to the base substrate, of the functional pattern to the base substrate being smaller than or equal to a distance from an edge, in the direction parallel to the base substrate, of the accommodating portion to the base substrate, and the functional pattern in its entirety does not extend beyond the accommodating portion,
wherein a surface of the part of the pixel defining layer except the plurality of opening on a side away from the base substrate is an uneven surface, which is formed during a material removal assembly rolls across the pixel defining layer, such that the uneven surface forms fine and continuous pits on the pixel defining layer,
wherein the surface of the part of the pixel defining layer except the plurality of opening on the side away from the base substrate has a plurality of strip-shaped grooves parallel to each other,
wherein a cross-section of the strip-shaped groove is triangular.

2. The light-emitting substrate according to claim 1, wherein at least two of the functional sub-layers in the light-emitting functional layer are the first functional sub-layers.

3. The light-emitting substrate according to claim 2, wherein, among the functional patterns arranged in the same accommodating portion, a distance from an edge, in the direction parallel to the base substrate, of a functional pattern farthest from the base substrate to the base substrate is smaller than a distance from an edge, in the direction parallel to the base substrate, of a functional pattern closest to the base substrate to the base substrate; or,
for every two adjacent functional patterns arranged in the same accommodating portion, a distance from an edge, in the direction parallel to the base substrate, of one functional pattern farther away from the base substrate to the base substrate is smaller than a distance from an edge, in the direction parallel to the base substrate, of the other functional pattern closer to the base substrate to the base substrate.

4. The light-emitting substrate according to claim 2, wherein the plurality of functional sub-layers comprise:
an emission layer comprising a plurality of light-emitting patterns, each of the light-emitting patterns being located in one of the accommodating portions;
at least one first functional sub-layer arranged on a side of the emission layer close to the base substrate; and
at least one first functional sub-layer arranged on a side of the emission layer away from the base substrate, wherein
in the same accommodating portion, the functional patterns of the first functional sub-layers arranged on both sides of the emission layer are configured to wrap the light-emitting patterns.

5. The light-emitting substrate according to claim 2, wherein all of the functional sub-layers in the light-emitting functional layer are the first functional sub-layers.

6. The light-emitting substrate according to claim 1, wherein an edge, in the direction parallel to the base substrate, of the functional pattern of the first functional sub-layer is uneven in a thickness direction of the light-emitting substrate.

7. The light-emitting substrate according to claim 1, wherein the first functional sub-layer is a hole injection layer, a hole transport layer, a light-emitting prime layer, a hole block layer, an electron transport layer, an electron injection layer, or an emission layer.

8. The light-emitting substrate according to claim 1, further comprising a second electrode layer positioned on a side of the light-emitting functional layer away from the base substrate, the second electrode layer being conformal to surfaces of the light-emitting functional layer and the pixel defining layer away from the base substrate.

9. A light-emitting equipment comprising the light-emitting substrate according to claim 1.

10. A display panel comprising:
a base substrate;

a pixel defining layer disposed on the base substrate, the pixel defining layer having a plurality of opening portions, and a part of the pixel defining layer except the plurality of opening portions having substantially a same thickness, with no step shape formed in the part of the pixel defining layer except the plurality of opening portions;

a first electrode layer comprising a plurality of first electrodes, at least a part of each of the first electrodes being exposed to one of the opening portions and constituting an accommodating portion with the opening portion; and a light-emitting functional layer arranged on a side of the first electrode layer away from the base substrate, the light-emitting functional layer comprising a plurality of functional sub-layers, at least one of which is a first functional sub-layer, the first functional sub-layer comprising a plurality of functional patterns, each of the functional patterns being located in one of the accommodating portions and being conformal to a surface of the accommodating portion, and a distance from an edge, in a direction parallel to the base substrate, of the functional pattern to the base substrate being smaller than or equal to a distance from an edge, in the direction parallel to the base substrate, of the accommodating portion to the base substrate, and the functional pattern in its entirety does not extend beyond the accommodating portion, wherein a surface of the part of the pixel defining layer except the plurality of opening on a side away from the base substrate is an uneven surface, which is formed during a material removal assembly rolls across the pixel defining layer, such that the uneven surface forms fine and continuous pits on the pixel defining layer, wherein the surface of the part of the pixel defining layer except the plurality of opening on the side away from the base substrate has a plurality of strip-shaped grooves parallel to each other, wherein a cross-section of the strip-shaped groove is triangular.

* * * * *